United States Patent
Lee

(10) Patent No.: US 11,984,326 B2
(45) Date of Patent: May 14, 2024

(54) HEAT DISSIPATING SUBSTRATE FOR SEMICONDUCTOR AND PREPARATION METHOD THEREOF

(71) Applicant: IMH INC., Gyeonggi-Do (KR)

(72) Inventor: Jong Eun Lee, Gyeonggi-do (KR)

(73) Assignee: IMH INC., Gyeonggi-Do (KR)

( * ) Notice: Subject to any disclaimer, the term of this patent is extended or adjusted under 35 U.S.C. 154(b) by 32 days.

(21) Appl. No.: 17/615,099

(22) PCT Filed: May 29, 2020

(86) PCT No.: PCT/KR2020/007026
§ 371 (c)(1),
(2) Date: Nov. 30, 2021

(87) PCT Pub. No.: WO2020/242255
PCT Pub. Date: Dec. 3, 2020

(65) Prior Publication Data
US 2022/0223435 A1 Jul. 14, 2022

(30) Foreign Application Priority Data

May 31, 2019 (KR) .......................... 10-2019-0064286
Dec. 27, 2019 (KR) .......................... 10-2019-0176073

(51) Int. Cl.
*H01L 21/48* (2006.01)
*H01L 23/367* (2006.01)
(Continued)

(52) U.S. Cl.
CPC ...... *H01L 21/4871* (2013.01); *H01L 21/4828* (2013.01); *H01L 21/4842* (2013.01);
(Continued)

(58) Field of Classification Search
CPC ................ C04B 37/021; C04B 37/026; H01L 21/4821–4882; H01L 23/14–15; H01L 23/36–3738
See application file for complete search history.

(56) References Cited

U.S. PATENT DOCUMENTS

2002/0096759 A1* 7/2002 Hirano .................. H05K 1/056
257/706
2010/0201002 A1 8/2010 Hiramatsu et al.
(Continued)

FOREIGN PATENT DOCUMENTS

| EP | 1 909 324 | 4/2008 |
| JP | 2001-57406 | 2/2001 |

(Continued)

OTHER PUBLICATIONS

JP-2004311691-A, Machine Translation. (Year: 2004).*
(Continued)

*Primary Examiner* — Andres Munoz
(74) *Attorney, Agent, or Firm* — Ladas & Parry, LLP

(57) ABSTRACT

Provided are a heat dissipating substrate and a preparation method thereof, which can form a precise pattern in a thick electrode metal plate and improve insulating strength and peel strength. heat dissipating substrate for semiconductor may include: an electrode metal plate having a plurality of electrode patterns which are electrically insulated from each other by a pattern space formed therebetween; a metal base disposed under the electrode metal plate, and configured to diffuse heat conducted from the electrode metal plate; an insulating layer formed between the electrode metal plate and the metal base; and an insulating material filled portion configured to fill the pattern space and a peripheral portion outside an electrode pattern group composed of the plurality of electrode patterns, and support the electrode patterns (Continued)

while brought in direct contact with side surfaces of the plurality of electrode patterns.

5 Claims, 18 Drawing Sheets

(51) Int. Cl.
  *H01L 23/373* (2006.01)
  *H01L 29/40* (2006.01)
  *H01L 33/64* (2010.01)

(52) U.S. Cl.
  CPC ........ *H01L 23/367* (2013.01); *H01L 23/3735* (2013.01); *H01L 29/401* (2013.01); *H01L 33/64* (2013.01)

(56) References Cited

U.S. PATENT DOCUMENTS

| 2014/0332951 | A1 |   | 11/2014 | Nakamura et al. |
| 2016/0133533 | A1 | * | 5/2016  | Lin ................... H01L 23/142 257/766 |

FOREIGN PATENT DOCUMENTS

| JP | 2003-297987   |   | 10/2003 |
| JP | 2004311691  A | * | 11/2004 |
| JP | 2005-116843   |   | 4/2005  |
| JP | 2008-205492   |   | 9/2008  |
| JP | 2013-243238   |   | 12/2013 |
| JP | 2014-154824   |   | 8/2014  |
| KR | 10-2002-0023667 |   | 3/2002  |
| KR | 10-2011-0032015 |   | 3/2011  |
| KR | 10-1336087    |   | 12/2013 |
| KR | 10-2055587    |   | 12/2019 |
| KR | 10-2283906    |   | 7/2021  |

OTHER PUBLICATIONS

International Search Report for PCT/KR2020/007026 dated Sep. 24, 2020 (now published as WO 2020/242255) with English translation provided by WIPO.

Written Opinion of the International Searching Authority for PCT/KR2020/007026 dated Sep. 24, 2020 (now published as WO 2020/242255) with English translation provided by WIPO.

Office Action in Korean Application No. 10-2019-0176073, dated Jan. 6, 2021, with English translation provided by Google Translate.

Notice of Allowance in Korean Application No. 10-2019-0176073, dated May 18, 2021 with English translation provided by Google Translate.

Office Action in Korean Application No. 10-2019-0064286, dated Sep. 27, 2019, with English translation provided by Google Translate.

Notice of Allowance in Korean Application No. 10-2019-0064286, dated Nov. 7, 2019, with English translation provided by Google Translate.

Extended European Search Report dated Jun. 20, 2023, 2023 for European Patent Application No. 20815097.9.

Office Action dated Jan. 31, 2023 for Japanese Patent Application No. 2021-571351 and its English translation from Global Dossier.

Notice of Allowance dated May 16, 2023 for Japanese Patent Application No. 2021-571351 and its English translation from Global Dossier.

International Preliminary Report on Patentability (Chapter I) for PCT/KR2020/007026 issued on Nov. 16, 2021 (now published as WO 2020/242255) with English translation provided by WIPO.

* cited by examiner

HEAT DISSIPATING SUBSTRATE FOR SEMICONDUCTOR AND PREPARATION METHOD THEREOF

CROSS-REFERENCE TO RELATED APPLICATIONS

This application is the national stage of International Application No. PCT/KR2020/007026, filed on May 29, 2020, which claims priority, under 35 U.S.C. 119(a), to Korean Patent Application No. 10-2019-0064286 filed in Korea on May 31, 2019, and Korean Patent Application No. 10-2019-0176073 filed in Korea on Dec. 27, 2019, the disclosures of which are incorporated by reference herein in their entireties.

TECHNICAL FIELD

The present disclosure relates to a heat dissipating substrate for mounting a semiconductor element, a semiconductor module including the same, and a preparation method thereof. More particularly, the present disclosure relates to a heat dissipating substrate which functions as a heat dissipating plate and a circuit board for mounting a semiconductor element, a preparation method of a heat dissipating substrate which has a thick electrode metal plate suitable for mounting a high-power semiconductor element or high-power LED, and structural characteristics of the heat dissipating substrate.

BACKGROUND ART

Recently, in the electric power industry, research and development are being actively conducted on the generation, storage, and utilization of new renewable energy such as sunlight generation or wind power generation. Furthermore, research and development are also being actively conducted on the efficiency improvement, stability and energy reduction of various electric/electronic devices including batteries and power systems of electric vehicles. A core part used in this technology is a power module using a power device, i.e. a power semiconductor module. In the lighting field, an LED light source having excellent efficiency and lifetime tends to be applied to a light source requiring high power, such as a vehicle headlight, a street lamp or a plant growth light for smart farm.

These power devices use a current ranging from several dozens to several hundreds of amperes, and also use a high voltage ranging from several hundreds to several thousands of volts. Therefore, a considerable amount of heat may be generated from the power module, and cause a malfunction and reliability problem of the corresponding device. In order to prevent such defects, it has become very important to rapidly dissipate heat generated from a power semiconductor element. In the case of a high-power LED light source module, heat dissipation is an important factor to decide the lifetime and efficiency of the corresponding device.

According to a conventional preparation method of a metal PCB (Printed Circuit Board) for a power semiconductor, an insulating layer is inserted between a copper foil and a metal substrate with high thermal conductivity, and stacked at high temperature and high pressure through a hot pressing process. Then, a metal PCB is manufactured through a general PCB preparation process. The metal PCB manufactured through the conventional technology generally has a thermal conductivity of 3 to 5 W/m·K, and needs to include a large heat sink attached thereto, in order to dissipate a sufficient amount of heat. The general PCB preparation process uses an etching or plating process to form a circuit electrode pattern in a layer made of copper foil.

However, it is difficult to apply the conventional preparation method of a metal PCB to a heat dissipating substrate for a high-power semiconductor. That is because, when the thickness of an electrode metal plate is increased to mount a high-power semiconductor, it is difficult to apply an etching or plating method to cope with the mounting process. In reality, when the thickness of an electrode metal plate is 0.3 mm or more in the corresponding technical field, it is determined that the profitability cannot be maintained through the etching or plating method. Furthermore, the cross-sectional profile of the electrode pattern may be degraded to easily cause dielectric breakdown.

Moreover, the etching or plating process uses toxic chemicals or heavy metals, thereby causing environmental pollution. Thus, there is a need for the development of an eco-friendly preparation method capable of minimizing discharge of pollutants and the structure of a heat dissipating substrate suitable for the preparation method.

DISCLOSURE

Technical Problem

Various embodiments are directed to a heat dissipating substrate having a thick electrode metal plate having a thickness of 0.2 mm or more, and a preparation method thereof.

Also, various embodiments are directed to a heat dissipating substrate which has a thick electrode metal plate to accomplish excellent heat dissipating performance and to improve insulating strength, and has high peel strength.

Also, various embodiments are directed to a preparation method of a heat dissipating substrate, which can effectively pattern a thick electrode metal plate, and efficiently prepare an eco-friendly heat dissipating substrate for semiconductor, which exhibits excellent insulating performance and high peel strength.

Technical Solution

In an embodiment, a heat dissipating substrate for semiconductor may include: an electrode metal layer having an electrode pattern on which a semiconductor element is mounted, the electrode pattern being formed by a pattern space; a metal base configured to constitute a heat dissipating body that diffuses and dissipates heat discharged from the semiconductor element through thermal conduction; an insulating layer having an electrical insulating property, and disposed between the electrode metal layer and the metal base; and a groove formed in one or more of a surface of the metal base, abutting on the insulating layer, and a surface of the electrode metal layer, abutting on the insulating layer, and a reinforcement protrusion formed by filling the groove with the same material as the insulating layer. The pattern space may include a portion which is vertically cut from the surface of the electrode metal layer.

The pattern space may be formed to a larger depth than the bottom surface of the electrode metal layer and a smaller depth than the bottom surface of the insulating layer, and expose the insulating layer.

The pattern space may further include a portion formed by isotropic etching.

The groove and the reinforcement protrusion may each have a dove tail-shaped cross-section.

In an embodiment, there is provided a preparation method of a heat dissipating substrate for semiconductor, which forms a pattern space such that an electrode metal layer bonded to an insulating layer formed on a metal base or to an electrode metal layer bonded to an insulating ceramic base constitutes an electrode pattern. The preparation method may include: a cutting step of forming a groove pattern by cutting the electrode metal layer to a predetermined depth smaller than the thickness of the electrode metal layer from one surface thereof, and leaving a remaining portion; and an etching step of forming the electrode pattern by etching the remaining portion left along the groove pattern, with the electrode metal layer bonded to the insulating layer or the ceramic base. The etching step may include a step of etching the remaining portion, with the remaining portion disposed toward the opposite side of the surface of the insulator layer or the ceramic base.

In an embodiment, a preparation method of a heat dissipating substrate for semiconductor may include: a bonding step of forming a multilayered heat dissipating substrate in which a metal base, an insulating layer and an electrode metal layer are sequentially stacked and bonded to one another; a cutting step of forming a groove pattern having a smaller depth than the bottom surface of the electrode metal layer by cutting the electrode metal layer from the surface of the electrode metal layer according to the shape of an electrode pattern, which is designed in advance, such that a remaining portion having a predetermined thickness is left between the adjacent electrode patterns; and an etching step of completely etching the remaining portion to expose the insulating layer, such that the adjacent electrode patterns are electrically insulated from each other. The bonding step may include a step of bonding the electrode metal layer and the metal base to each other with the insulating layer interposed therebetween, wherein a groove is formed in a surface of the electrode metal layer or the metal base, which abuts on the insulating layer, before the bonding step, and then the electrode metal layer and the metal base are bonded to each other through a vacuum hot pressing process, and simultaneously, a reinforcement protrusion connected to the insulating layer is formed.

The groove and the reinforcement protrusion may each have a dove tail-shaped cross-section.

In an embodiment, a preparation method of a heat dissipating substrate for semiconductor may include: a cutting step of forming a groove having a smaller depth than the bottom surface of an electrode metal layer by cutting the electrode metal layer from the surface of the electrode metal layer according to the shape of an electrode pattern, which is designed in advance, such that a remaining portion having a predetermined thickness is left between the adjacent electrode patterns; a bonding step of bonding a metal base, an insulating layer and the electrode metal layer, which are sequentially stacked, such that the flat bottom surface of the electrode metal layer abuts on the insulating layer; and an etching step of completely etching the remaining portion to expose the insulating layer, such that the adjacent electrode patterns are electrically insulated from each other. The bonding step may include a step of bonding the electrode metal layer and the metal base to each other with the insulating layer interposed therebetween, wherein a groove is formed in a surface of the electrode metal layer or the metal base, which abuts on the insulating layer, before the bonding step, and then the electrode metal layer and the metal base are bonded to each other through a vacuum hot pressing process, and simultaneously, a reinforcement protrusion connected to the insulating layer is formed.

The groove and the reinforcement protrusion may each have a dove tail-shaped cross-section.

In an embodiment, a heat dissipating substrate for semiconductor may include: an electrode metal plate having a plurality of electrode patterns which are electrically insulated from each other by a pattern space formed therebetween; a metal base disposed under the electrode metal plate, and configured to diffuse heat conducted from the electrode metal plate; an insulating layer formed between the electrode metal plate and the metal base; and an insulating material filled portion configured to fill the pattern space and a peripheral portion outside an electrode pattern group composed of the plurality of electrode patterns and support the electrode patterns while brought in direct contact with side surfaces of the plurality of electrode patterns.

The insulating layer and the insulating material filled portion may be made of the same insulating resin and formed integrally with each other to form an insulating part.

The heat dissipating substrate may further include an insulating ceramic mesh buried in the insulating layer between the electrode metal plate and the metal base.

The metal base may include a stepped portion formed by cutting a portion of the metal base under the pattern space and the peripheral portion to a depth below the top surface of the metal base located right under the plurality of electrode patterns, and the insulating material filled portion may be expanded to come into direct contact with side and bottom surfaces of the stepped portion.

The heat dissipating substrate may further include a first notch formed concavely at side surfaces of the plurality of electrode patterns or a second notch formed concavely at a side surface of the stepped portion of the metal base, wherein the insulating material filled portion is formed to fill the first or second notch.

In an embodiment, there is provided a preparation method of a heat dissipating substrate for semiconductor, which includes a plurality of electrode patterns, a pattern space formed between the respective electrode patterns so as to electrically insulate the electrode patterns, and a peripheral portion surrounding the outside of an electrode pattern group composed of the plurality of electrode patterns. The preparation method may include: forming a groove pattern corresponding to the pattern space and the peripheral portion by cutting an electrode metal plate, which is to form the plurality of electrode patterns, to a predetermined depth smaller than the thickness of the electrode metal plate from one surface thereof, and leaving a remaining portion; printing an insulating resin onto at least one surface of the electrode metal plate having the groove pattern formed therein, between the one surface of the electrode metal plate and one surface of a metal base facing the electrode metal plate, such that the groove pattern is filled with an insulating material, and bonding the electrode metal plate and the metal base through the insulating resin; and separating the plurality of electrode patterns from each other by removing the remaining portion.

The remaining portion may be removed through a cutting process.

When the electrode metal plate and the metal base are bonded, an insulating resin may be printed onto each of one surface of the electrode metal plate and one surface of the metal base, and the electrode metal plate and the metal base may be bonded to each other with an insulating ceramic mesh inserted therebetween.

In an embodiment, a preparation method of a heat dissipating substrate for semiconductor may include: forming a multilayered substrate in which a metal base, an insulating layer and an electrode metal plate are sequentially stacked; forming a groove pattern corresponding to a pattern space defining a plurality of electrode patterns and a peripheral portion outside an electrode pattern group composed of the plurality of electrode patterns, by cutting the multilayered substrate to a predetermined depth below the upper surface of the metal base from the electrode metal plate side; and forming an insulating material filled portion by filling the groove pattern with an insulating resin and curing the insulating resin.

When the groove pattern is formed, a first notch may be concavely formed at side surfaces of the plurality of electrode patterns, or a second notch may be concavely formed at a side surface of a stepped portion of the metal base.

Advantageous Effects

In accordance with the embodiments of the present disclosure, it is possible to provide a heat dissipating substrate having a thick electrode metal plate having a thickness of 0.2 mm or more, and a preparation method which can efficiently prepare the heat dissipating substrate.

Furthermore, it is possible to provide a heat dissipating substrate which has a thick electrode metal plate to accomplish excellent heat dissipating performance and to improve insulating strength, and has high peel strength.

Furthermore, it is possible to provide a preparation method of a heat dissipating substrate, which can effectively pattern a thick electrode metal plate, and efficiently prepare an eco-friendly heat dissipating substrate for semiconductor, which exhibits excellent insulating performance and high peel strength.

Furthermore, the preparation method may exclude an etching and plating process which cause environmental pollution, and replace the etching and plating process with a mechanical process which uses or discharges no toxic chemicals and heavy chemicals, thereby preparing a heat dissipating substrate for semiconductor through an eco-friendly process.

MODE FOR INVENTION

Figures 1A, 1B:
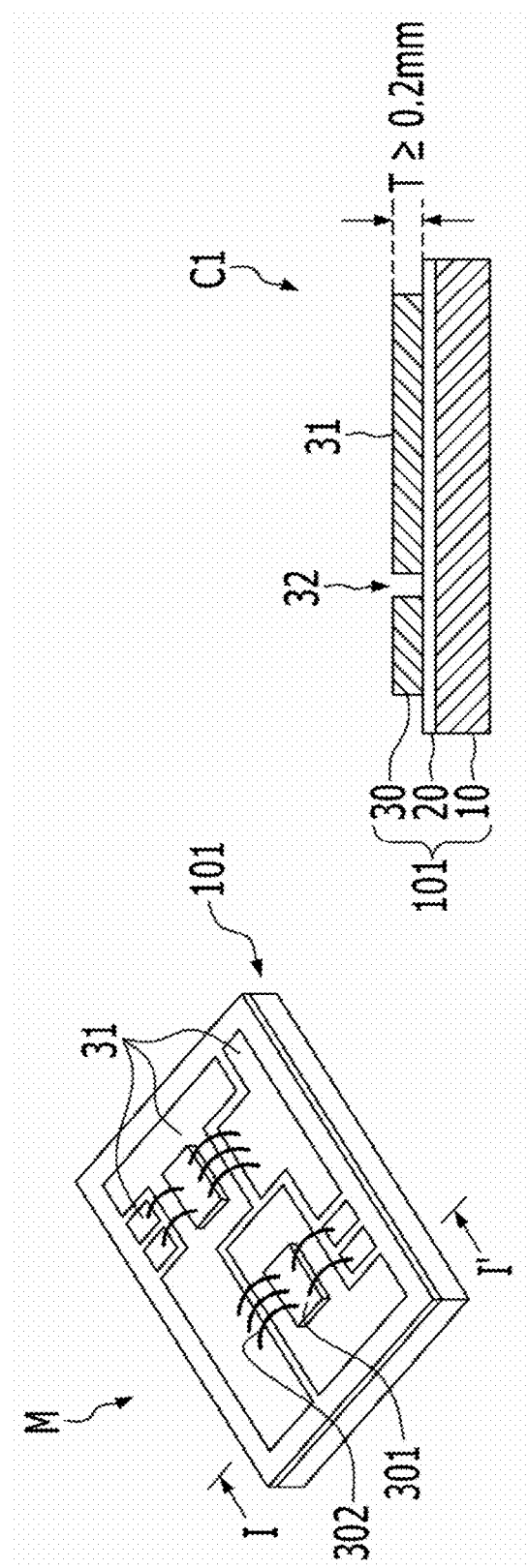
FIGS. 1A and 1B illustrate a power semiconductor module in accordance with an embodiment of the present disclosure.

Hereafter, various embodiments of the present disclosure will be described with reference to the accompanying drawings. The technical idea of the present disclosure will be more clearly understood through the embodiments. Furthermore, the present disclosure is not limited to the following embodiments, but may be modified in various manners without departing from the technical idea to which the present disclosure pertains. Like reference numerals represent components having common characteristics from the viewpoint of the present disclosure, and the descriptions of components having the same reference numerals as those mentioned in the descriptions of one drawing may be omitted from descriptions for the other drawings. In this specification, directional terms such as upper, lower, top and bottom are based on directions illustrated in the accompanying drawings.

FIGS. 1A and 1B illustrate a power semiconductor module in accordance with an embodiment of the present disclosure.

In FIG. 1A, a power semiconductor module M in accordance with an embodiment of the present disclosure includes a heat dissipating substrate 101 for semiconductor and a power semiconductor element 301. The power semiconductor element 301 is mounted on an electrode pattern 31 at the top surface of the heat dissipating substrate 101 for semiconductor, and electrically connected to the electrode pattern 31 through a wire bonding 302.

FIG. 1B illustrates a cross-section taken along line I-I' of FIG. 1A. The heat dissipating substrate 101 for semiconductor is composed of a metal base 10, an insulating layer 20 and an electrode metal layer 30, which are sequentially stacked from the bottom of the drawing. The metal base 10 may be made of a metal such as copper or aluminum, which has excellent thermal conductivity, and the insulating layer 20 may be made of synthetic resin, oxide or nitride, which has an electrical insulation property. The insulating layer 20 may be made of a material with excellent thermal conductivity and thermal resistance, in addition to the electric insulation property. Furthermore, the insulating layer 20 may have an adhesion or bonding property and thus serve to bond the metal base 10 and the electrode metal layer 30 to each other. The electrode metal layer 30 may be made of a metal such as copper or copper-manganese alloy, which has low specific resistance and excellent thermal conductivity. The electrode pattern 31 is formed by a pattern space 32 which is formed by removing a portion of the electrode metal layer 30 up to the bottom, and exposes the insulating layer 20. Desirably, the electrode metal layer 30 may have a thickness of 0.2 mm or more.

Figure 2B:
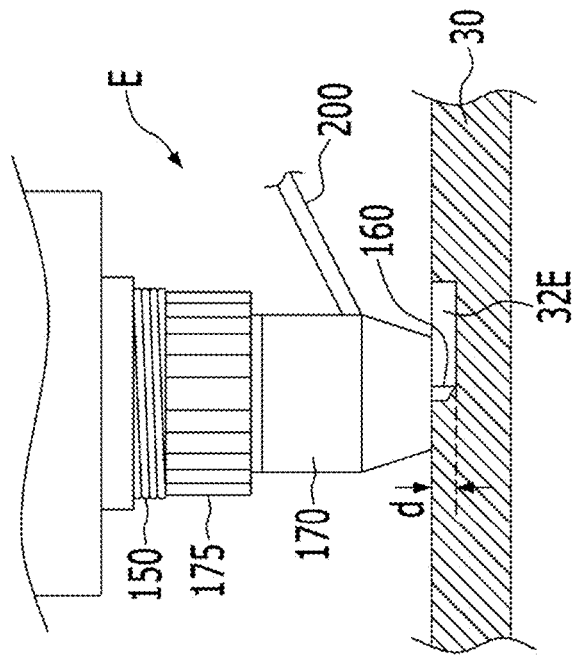
FIGS. 2A and 2B illustrate an electrode patterning process of a heat dissipating substrate for semiconductor in accordance with an embodiment of the present disclosure.
Figure 2A:
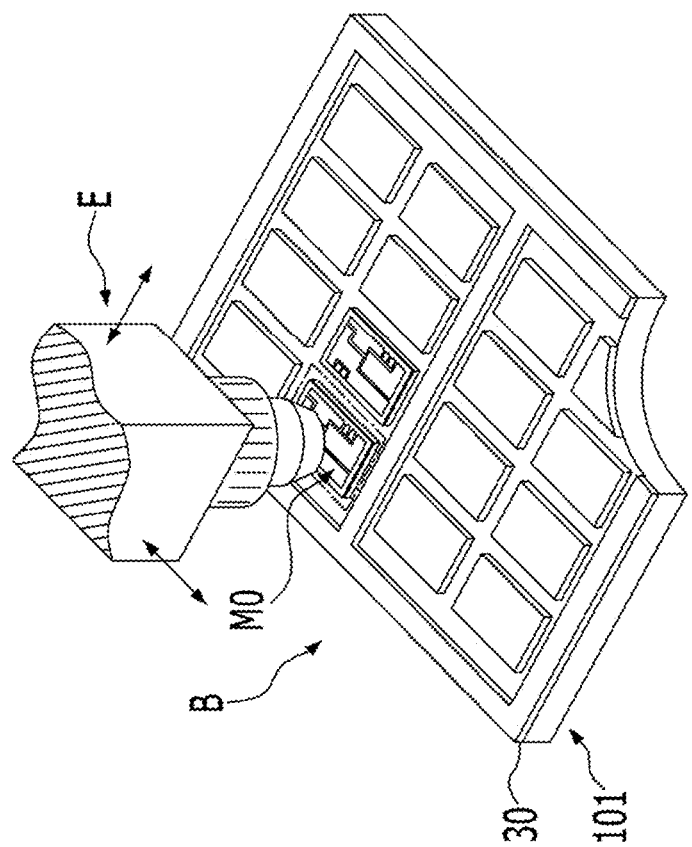

FIGS. 2A and 2B illustrate an electrode patterning process of a heat dissipating substrate for semiconductor in accordance with an embodiment of the present disclosure.

FIG. 2A illustrates, as an example of a mass production process, a process of patterning an electrode metal layer 30 through a constant depth cutting machine E, such that a plurality of circuit patterns corresponding to semiconductor modules, respectively, are arranged in an array in the electrode metal layer 30 constituting the top surface of a multilayered heat dissipating substrate B having a large area.

FIG. 2B illustrates the detailed configuration of the constant depth cutting machine E. The descriptions of the detailed configuration of the constant depth cutting machine E are disclosed in Korean Patent No. 10-1336087. As the constant depth cutting machine E cuts the electrode metal layer 30 while maintaining a predetermined depth d, a groove pattern 32E constituting the pattern space is formed.

Figure 3:
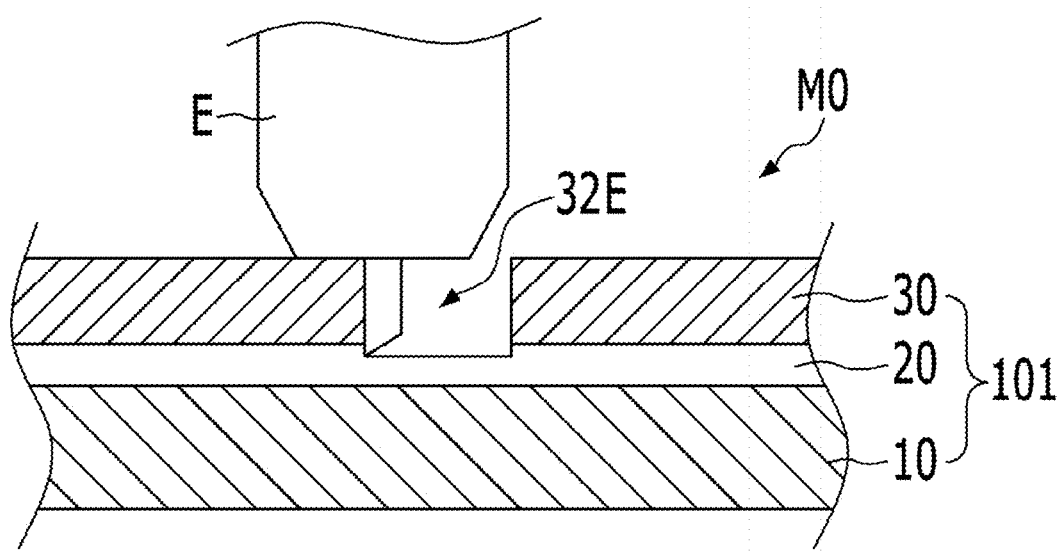
FIG. 3 illustrates an electrode patterning process using a cutting machine in accordance with an embodiment of the present disclosure.

FIG. 3 illustrates an electrode patterning process using a cutting machine in accordance with an embodiment of the present disclosure.

FIG. 3 illustrates a preparation method of a heat dissipating substrate M0 for semiconductor in accordance with a first embodiment. While a metal base 10, an insulating layer 20 and an electrode metal layer 30 are sequentially stacked from the bottom, a constant depth cutting machine E is used to form a pattern space 32 having a depth that is larger than the thickness of the electrode metal layer 30 and exposes only the insulating layer 20.

Figure 4A:
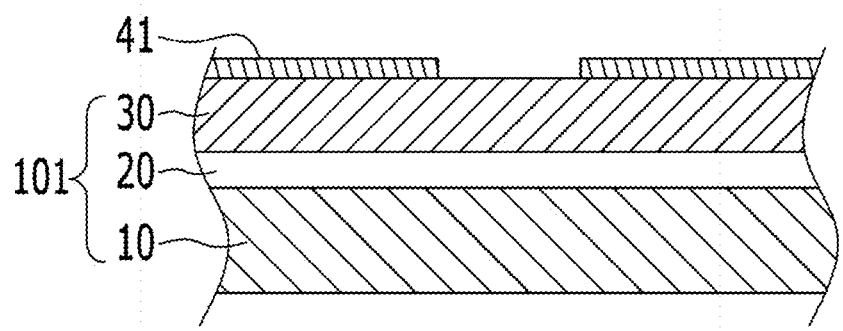
FIGS. 4A to 4C illustrate a preparation method of a heat dissipating substrate for semiconductor in accordance with an embodiment of the present disclosure.
Figure 4B:
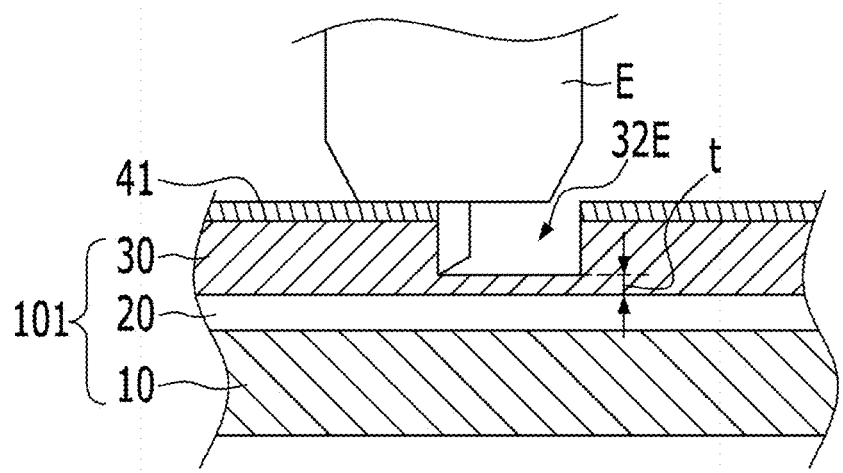
Figure 4C:
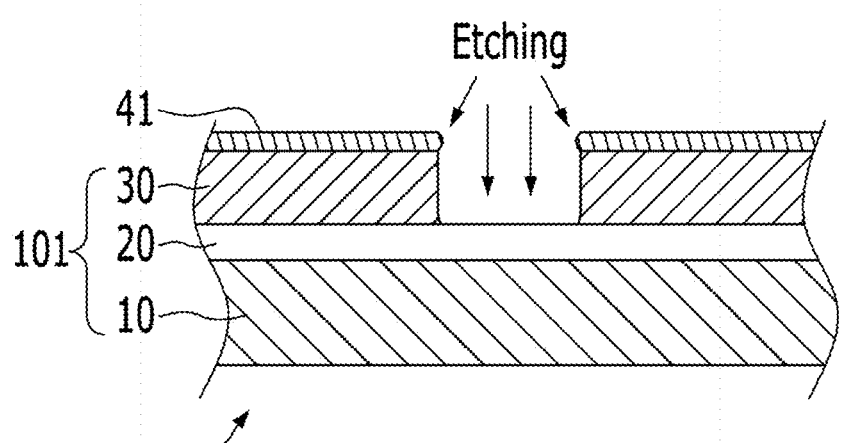

FIGS. 4A to 4C illustrate a preparation method of a heat dissipating substrate for semiconductor in accordance with an embodiment of the present disclosure. FIGS. 4A to 4C illustrate a preparation method of a heat dissipating substrate M1 for semiconductor in accordance with a second embodiment.

Referring to FIG. 4A, a multilayered heat dissipating substrate 101 in which a metal base 10, an insulating layer 20 and an electrode metal layer 30 are sequentially stacked from the bottom as in the embodiment of FIG. 3 is formed, and an electrode pattern-shaped mask pattern 41 is formed on the top surface of the electrode metal layer 30.

Referring to FIG. 4B, a constant depth cutting machine E is used to form a groove pattern 32E corresponding to a pattern space in a portion on which the mask pattern 41 is not printed. At this time, a remaining portion having a thickness t of 0.05 mm to 0.1 mm is left at the bottom of the groove pattern 32E Referring to FIG. 3C, the remaining portion at the bottom of the groove pattern is removed through an etching process, such that the insulating layer 20 is exposed. When the multilayered heat dissipating substrate 101 is cut into a plurality of parts corresponding to the respective modules, the heat dissipating substrate M1 for semiconductor is completed.

Figure 5A:
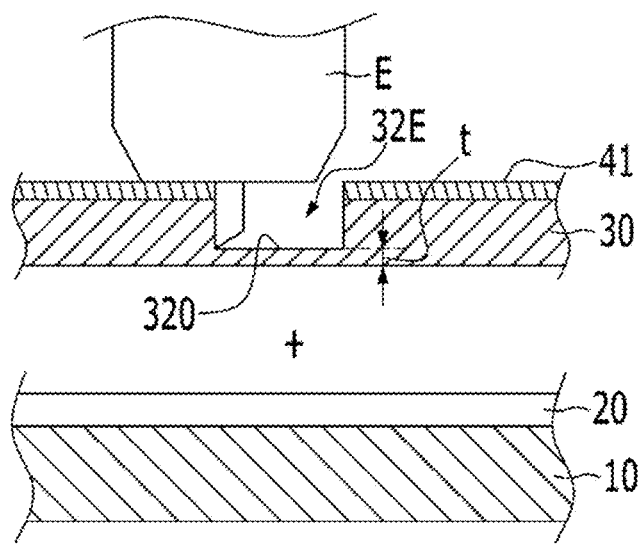
FIGS. 5A to 5C illustrate a preparation method of a heat dissipating substrate for semiconductor in accordance with an embodiment of the present disclosure.
Figure 5B:
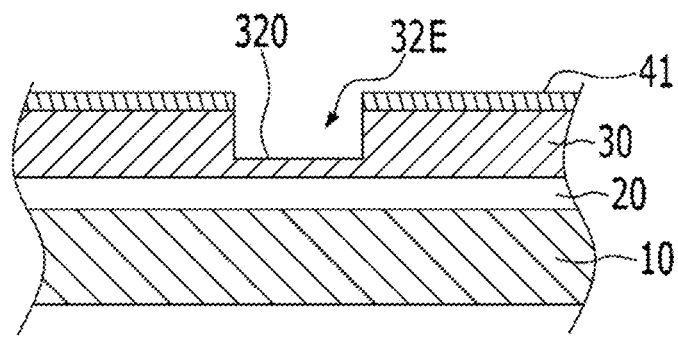
Figure 5C:
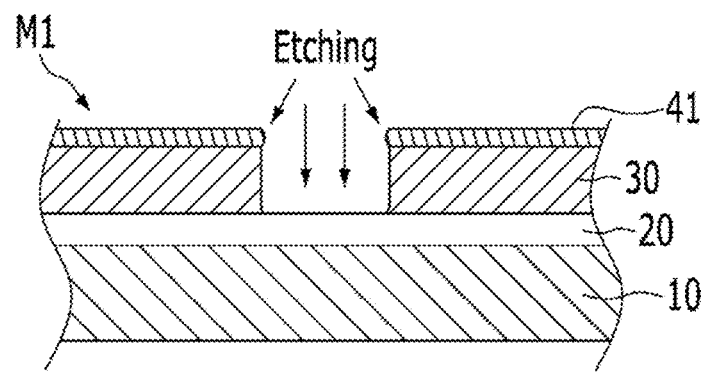

FIGS. 5A to 5C illustrate a preparation method of a heat dissipating substrate for semiconductor in accordance with an embodiment of the present disclosure. FIGS. 5A to 5C illustrate a preparation method of a heat dissipating substrate M1 for semiconductor in accordance with a third embodiment.

Referring to FIG. 5A, a groove pattern 32E is formed at the top surface of an electrode metal layer 30 through a constant depth cutting machine E. At this time, a remaining portion 320 having a predetermined thickness t is left at the bottom of the groove pattern 32E. The predetermined thickness t is equal to that in the embodiment of FIG. 4. Separately, a substrate having an insulating layer 20 stacked on the top surface of a metal base 10 is prepared.

Referring to FIG. 4B, the electrode metal layer 30 having the groove pattern 32E formed in FIG. 4A is bonded to the substrate having the insulating layer 20 stacked on the top surface of the metal base 10. During the bonding process, a vacuum hot pressing process may be applied. The electrode metal layer 30 may be bonded to the substrate through an adhesive with excellent thermal conductivity, and the insulating layer 20 may have a function as an adhesive layer.

Referring to FIG. 5C, the remaining portion 320 at the bottom of the groove pattern is removed through an etching process, such that the insulating layer 20 is exposed. When the heat dissipating substrate is cut into a plurality of parts corresponding to the respective modules, the heat dissipating substrate M1 for semiconductor is completed.

Figure 6A:
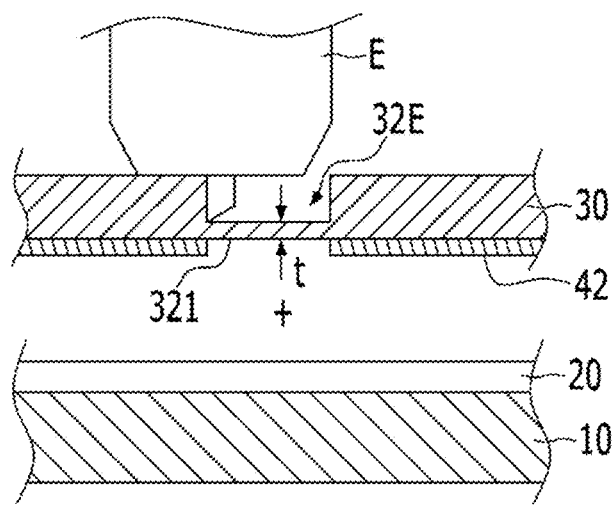
FIGS. 6A to 6C illustrate a preparation method of a heat dissipating substrate for semiconductor in accordance with an embodiment of the present disclosure.
Figure 6B:
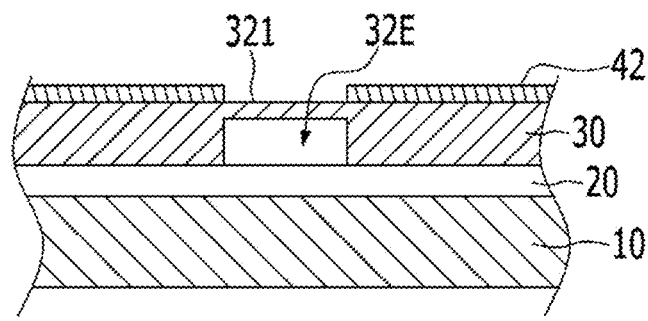
Figure 6C:
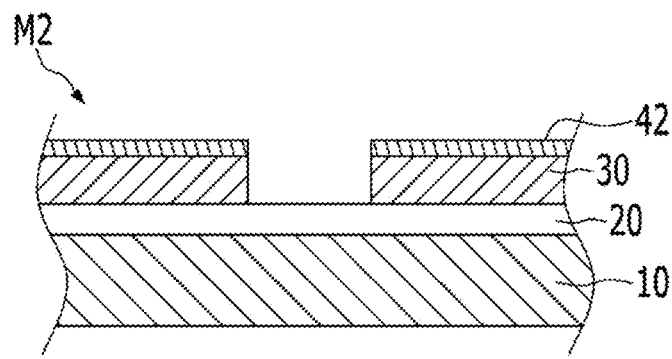

FIGS. 6A to 6C illustrate a preparation method of a heat dissipating substrate for semiconductor in accordance with an embodiment of the present disclosure. FIGS. 6A to 6C illustrate a preparation method of a heat dissipating substrate M2 for semiconductor in accordance with a fourth embodiment.

Referring to FIG. 6A, a groove pattern 32E is formed in an electrode metal layer 30 as in the embodiment of FIG. 5, and a remaining portion 331 having a predetermined thickness t is left. The process of FIG. 6A is different from that of FIG. 5A in that one side of the electrode metal layer 30, corresponding to the opposite side of a mask pattern 42, is processed through a constant depth cutting machine E. Separately, a substrate having an insulating layer 20 stacked on the top surface of a metal base 10 is prepared.

Referring to FIG. 6B, the electrode metal layer 30 having the groove pattern 32E formed in FIG. 6A is bonded to the substrate in which the metal base 10 and the insulating layer 20 are stacked. At this time, the surface at which the groove pattern is formed abuts on the insulating layer 20, and the surface at which the mask pattern 42 and the remaining portion 331 are present becomes the top surface.

Referring to FIG. 3C, the remaining portion 321 exposed through the surface on which the mask pattern 42 is formed is removed through an etching process. Instead of the etching process, the constant depth cutting machine E may be used to additionally cut the remaining portion 321. In this case, the cutting depth of the constant depth cutting machine E is larger than the thickness t of the remaining portion 331, and does not exceed the depth of a pattern space 32. As a result, the structure in which the insulating layer 20 is exposed through the pattern space 32 is formed. When the multilayered heat dissipating substrate is cut into a plurality of parts corresponding to the respective modules, the heat dissipating substrate M2 for semiconductor is completed.

Figure 7A:
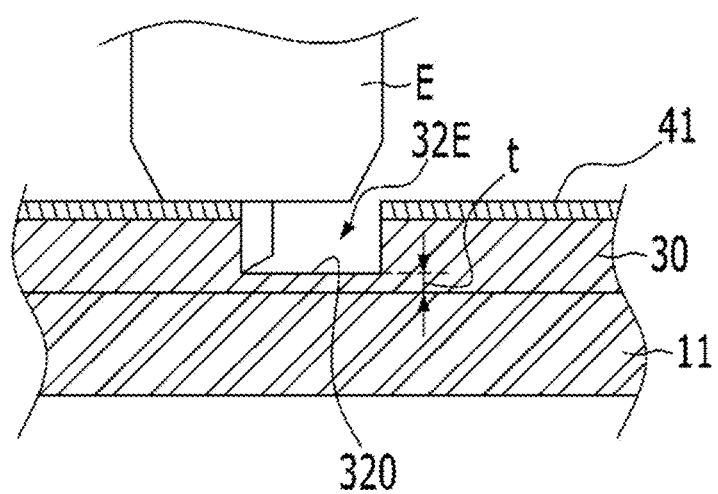
FIGS. 7A and 7B illustrate a preparation method of a heat dissipating substrate for semiconductor in accordance with an embodiment of the present disclosure.
Figure 7B:
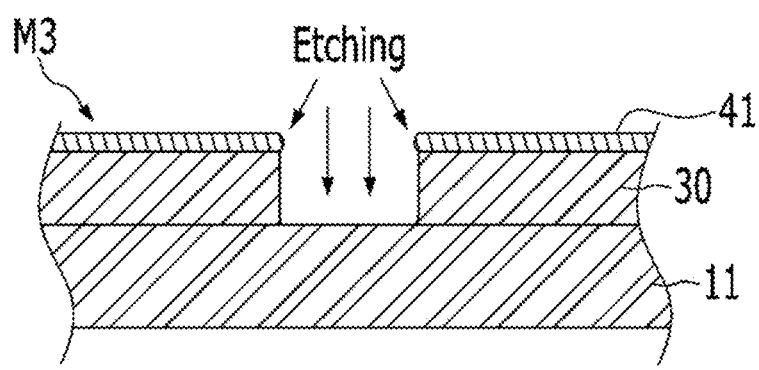

FIGS. 7A and 7B illustrate a preparation method of a heat dissipating substrate for semiconductor in accordance with an embodiment of the present disclosure. FIGS. 7A and 7B illustrate a preparation method of a heat dissipating substrate M3 for semiconductor in accordance with a fifth embodiment.

Referring to FIG. 7A, a ceramic base 11 is applied as a heat sink. A multilayered heat dissipating substrate having an electrode metal layer 30 bonded onto the ceramic base 11 is provided, and a mask pattern 41 is formed on the top surface of the electrode metal layer 30. The ceramic base 11 may be made of aluminum nitride (AlN) or silicon carbide (SiC), and the ceramic base 11 and the electrode metal layer may be bonded to each other through a commercialized technology such as DCB (Direct Copper Bonding) or AMB (Active Metal Brazing).

When a constant depth cutting machine E is used to form a groove pattern 32E, a remaining portion 320 having a predetermined depth t is left. The remaining portion 320 serves as a margin that prevents a cutting tool from coming into direct contact with the ceramic base 11 through the electrode metal layer 30.

Referring to FIG. 7B, the remaining portion 320 is removed through an etching process from the top surface, such that the ceramic base 11 is exposed through a pattern space 32. When the multilayered heat dissipating substrate is cut into a plurality of parts corresponding to the respective modules, the heat dissipating substrate M3 for semiconductor is completed.

Figure 8A:
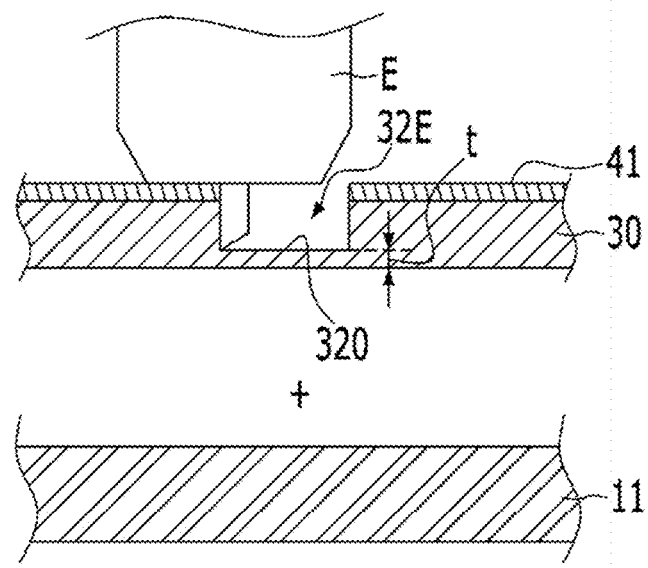
FIGS. 8A to 8C illustrate a preparation method of a heat dissipating substrate for semiconductor in accordance with an embodiment of the present disclosure.
Figure 8B:
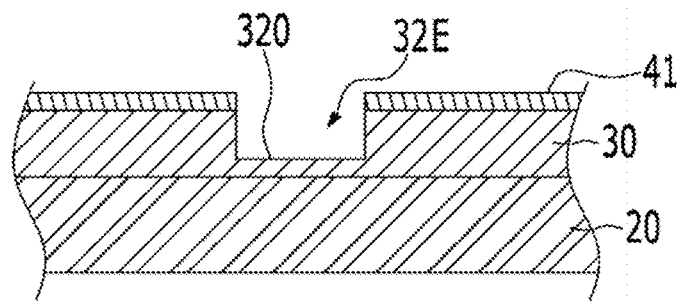
Figure 8C:
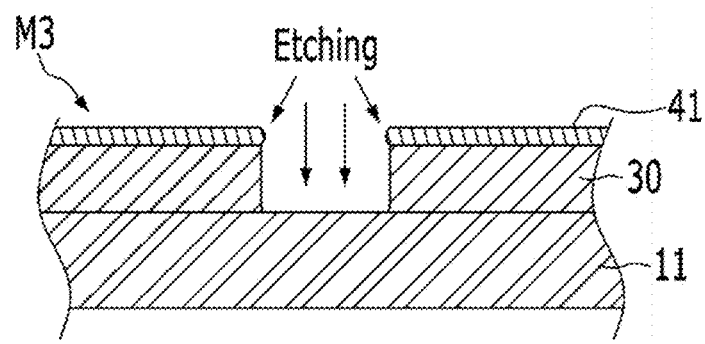

FIGS. 8A to 8C illustrate a preparation method of a heat dissipating substrate for semiconductor in accordance with an embodiment of the present disclosure. FIGS. 8A to 8C illustrate a preparation method of a heat dissipating substrate M3 for semiconductor in accordance with a sixth embodiment.

Referring to FIG. 8A, a constant depth cutting machine E is used to form a groove pattern 32E with a mask pattern 41 formed on the top surface of an electrode metal layer 30 as in FIG. 5A, and a remaining portion 320 having a predetermined thickness t is left at the bottom of the groove pattern 32E. Separately, a ceramic base 11 is prepared. The material of the ceramic base 11 is the same as that described in the embodiment of FIG. 7.

Referring to FIG. 7B, the electrode metal layer 30 in which the groove pattern 32E is formed with the remaining portion 320 left at the bottom in FIG. 8A is bonded to the ceramic base 11 such that the remaining portion 320 abuts on the ceramic base 11. As the bonding technology, the above-described DCB or AMB may be applied.

Referring to FIG. 8C, the remaining portion is removed from the top surface at which the mask pattern 41 is formed, through an etching process, as in FIG. 7B. When the multilayered heat dissipating substrate is cut into a plurality of parts corresponding to the respective modules, the heat dissipating substrate M3 for semiconductor is completed.

Figure 9A:
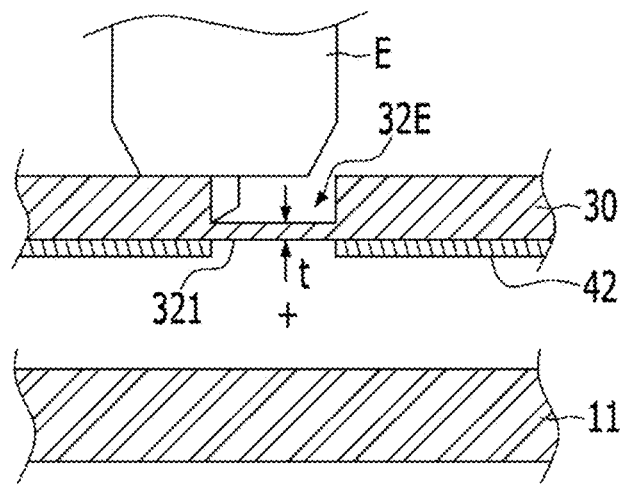
FIGS. 9A to 9C illustrate a preparation method of a heat dissipating substrate for semiconductor in accordance with an embodiment of the present disclosure.
Figure 9B:
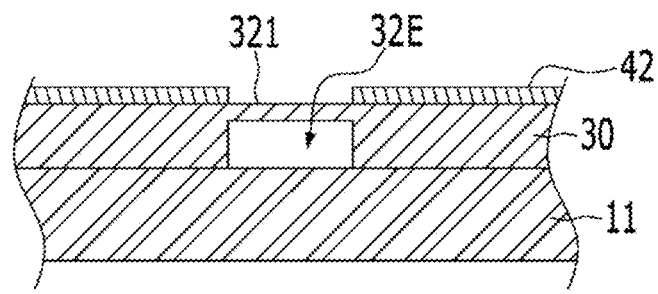
Figure 9C:
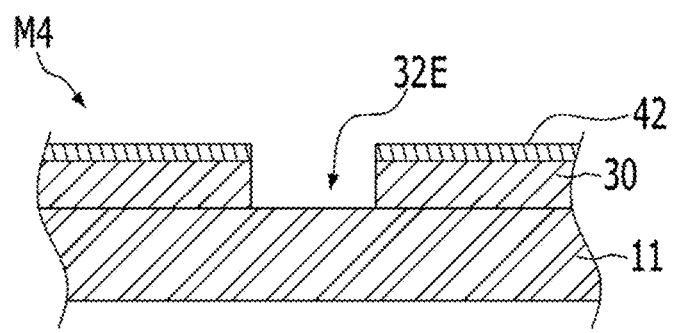

FIGS. 9A to 9C illustrate a preparation method of a heat dissipating substrate for semiconductor in accordance with an embodiment of the present disclosure. FIGS. 9A to 9C illustrate a preparation method of a heat dissipating substrate M4 for semiconductor in accordance with a seventh embodiment.

Referring to FIG. 9A, one side of an electrode metal layer 30, corresponding to the opposite side of a mask pattern 42, is processed through a constant depth cutting machine E as in FIG. 6A, such that a groove pattern 32E is formed in the electrode metal layer 30, and a remaining portion 321 having a predetermined thickness t is left. Separately, a ceramic base 11 is prepared.

Referring to FIG. 9B, the ceramic base 11 and the electrode metal layer 30 are bonded to each other, such that the groove pattern 32E faces the ceramic base 11, and the mask pattern 42 and the remaining portion 321 are located at the top surface of the electrode metal layer 30, corresponding to the opposite side of the groove pattern 32E. As the bonding technology, the technology described in the embodiment of FIG. 8 may be applied.

Referring to FIG. 9C, the remaining portion 321 is removed through an etching process. Instead of the etching process, the constant depth cutting machine E may be used to additionally cut the remaining portion 321. In this case, the cutting depth of the constant depth cutting machine E is larger than the thickness t of the remaining portion 321, and does not exceed the depth of a pattern space 32. When the multilayered heat dissipating substrate is cut into a plurality of parts corresponding to the respective modules, the heat dissipating substrate M4 for semiconductor is completed.

Figure 10:
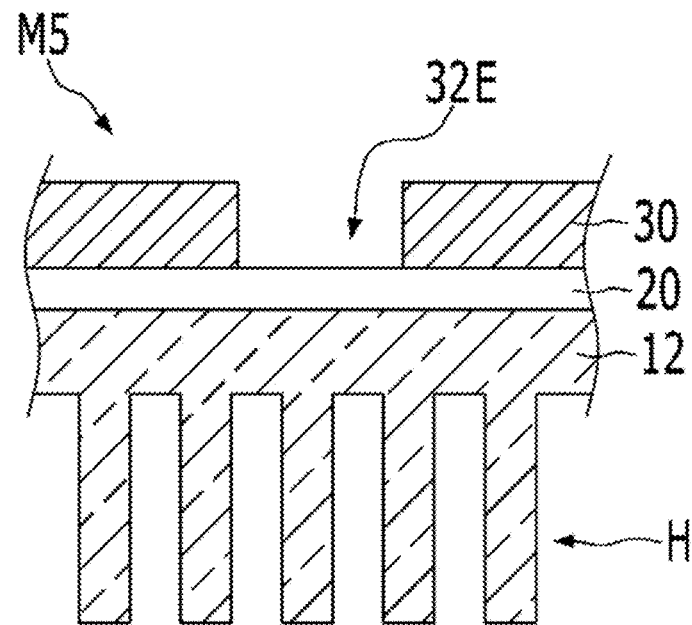
FIG. 10 illustrates a heat dissipating substrate for semiconductor in accordance with an embodiment of the present disclosure.

FIG. 10 illustrates a heat dissipating substrate for semiconductor in accordance with an embodiment of the present disclosure.

A heat dissipating substrate M5 for semiconductor in accordance with the present embodiment is characterized in that a heat sink structure H and a metal base 12 are formed integrally as one body. An electrode metal layer 30 and an insulating layer 20 may be formed through any one of the methods in accordance with the embodiments of FIGS. 3 to 6. Instead of the metal base 12, a ceramic base integrated with a heat sink structure may be employed.

In the above-described embodiments, the cross-sectional profile of a stepped portion constituting the boundary between the pattern space 32 and the electrode pattern 31 is formed perpendicular or almost perpendicular to the surface of the electrode metal layer 30 and the surface to which the insulating layer 20 or the ceramic base 11 is exposed.

When the pattern space 32 is formed only through the constant depth cutting machine E without an etching process as in the embodiment of FIG. 3, 6 or 9, the stepped portion has a cross-sectional profile substantially perpendicular to the two surfaces. Even when the remaining portion 320 or 321 is removed through an etching process as in the embodiments of FIGS. 4 to 9, the thickness t of the remaining portion is less than 0.1 mm, which indicates that the remaining portion corresponds to only a small portion of the electrode metal layer 30. Therefore, although the remaining portion is removed through an isotropic wet etching process, the portion at which the stepped portion and the insulating layer 20 or the ceramic base 11 meet each other is formed to have a curvature radius R of 0.1 mm or less. Therefore, an excellent insulating property may be provided between two electrode patterns 31 adjacent to each other, with the pattern space 32 formed therebetween.

Figure 11:
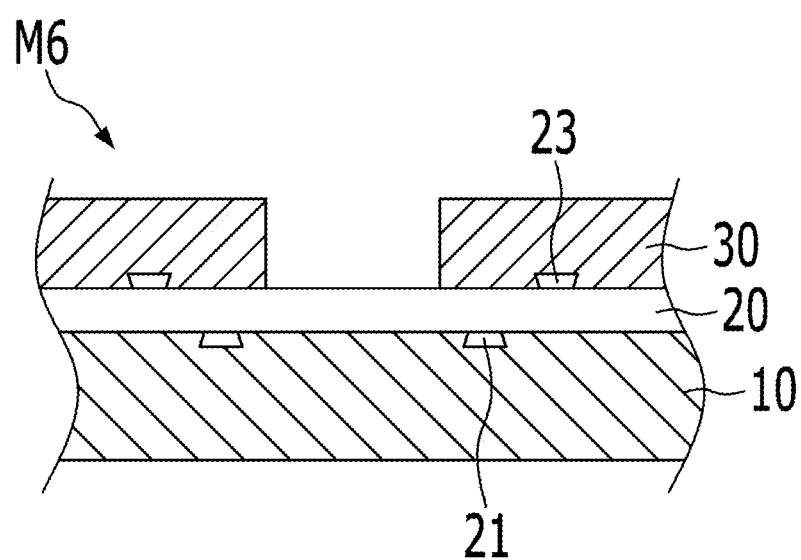
FIG. 11 illustrates a heat dissipating substrate for semiconductor in accordance with an embodiment of the present disclosure.

FIG. 11 illustrates a heat dissipating substrate for semiconductor in accordance with an embodiment of the present disclosure.

A heat dissipating substrate M6 for semiconductor in accordance with the present embodiment may further include reinforcement protrusions 21 and 23 formed at any one or both of a surface of a metal base 10 abutting on an insulating layer 20 and a surface of an electrode metal layer 30 abutting on the insulating layer 20, the reinforcement protrusions 21 and 23 having a dove tail-shaped cross-section. As illustrated in FIG. 11, the reinforcement protrusions 21 and 23 may be formed by filling grooves, whose cross-sectionals are formed in a dove-tail shape, with the same material as the insulating layer 20. As the material of the insulating layer 20, epoxy resin having excellent electrical insulating property and thermal conductivity may be applied.

During the preparation process of the heat dissipating substrate M6 for semiconductor in accordance with the present embodiment, the dove tail-shaped grooves may be formed in the metal base 10 and/or the electrode metal layer 30, and epoxy resin may be interposed between the metal base 10 and the electrode metal layer 30. Then, the metal base 10, the epoxy resin and the electrode metal layer 30 may be bonded to one another through a vacuum hot pressing process, in order to form the reinforcement protrusions 21 and 23.

The reinforcement protrusions 21 and 23 which are formed in the above-described manner may prevent the interfaces of the insulating layer 20 and the metal base 10 or the interfaces of the insulating layer 20 and the electrode metal layer 30 from being separated from each other, even though the material constituting the metal base 10 and the material constituting the electrode metal layer 30 have a difference in linear expansion coefficient therebetween.

Figure 12:
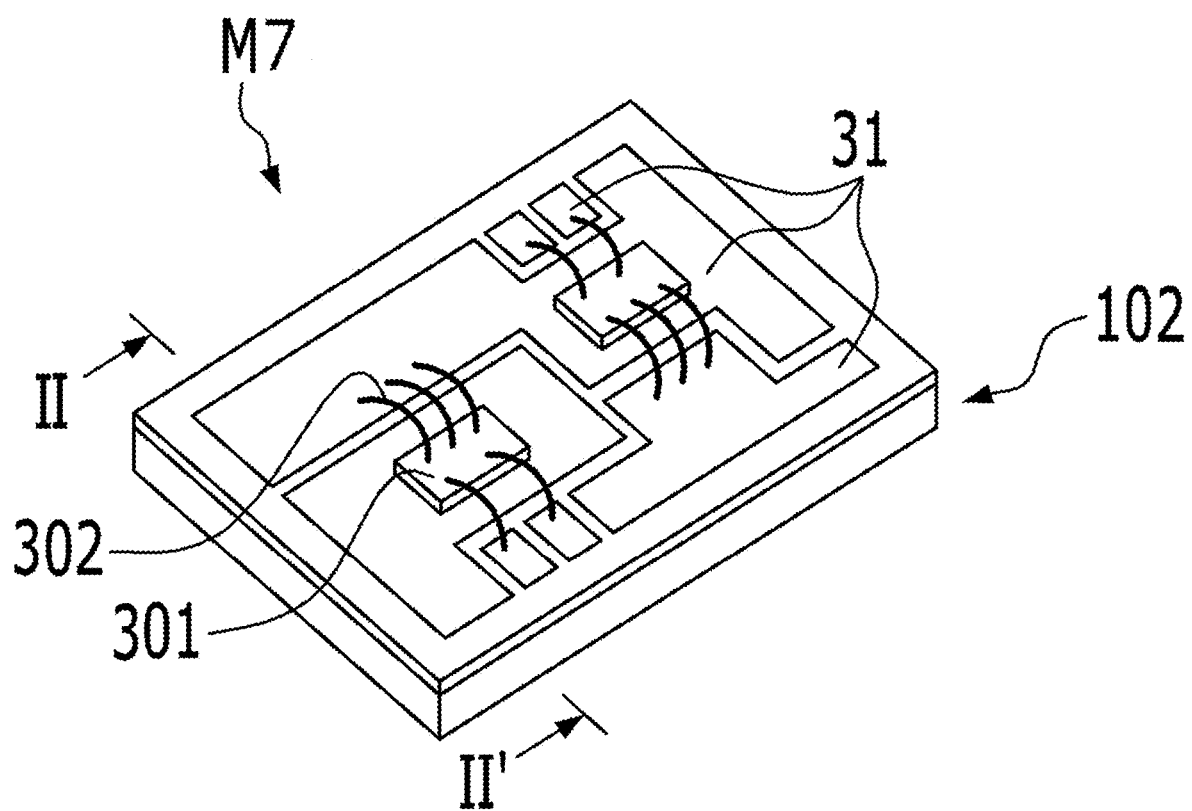
FIG. 12 illustrates a power semiconductor module to which a heat dissipating substrate for semiconductor in accordance with an embodiment of the present disclosure is applied.

FIG. 12 illustrates a power semiconductor module to which a heat dissipating substrate for semiconductor in accordance with an embodiment of the present disclosure is applied.

A power semiconductor module M7 to which a heat dissipating substrate 102 for semiconductor in accordance with an embodiment of the present disclosure is applied includes a power semiconductor element 301. The power semiconductor element 301 may be mounted on at least one electrode pattern of a plurality of electrode patterns 31 formed on the top surface of the heat dissipating substrate 102 for semiconductor, and electrically connected to the electrode pattern through a wire bonding 302. As another example, a power semiconductor element may have a plurality of input/output terminals or pad electrodes, which are mounted on the plurality of electrode patterns 31 of the heat dissipating substrate 102 for semiconductor through SMT (Surface Mount Technology). The plurality of electrode patterns 31 are formed in an island shape surrounded by an insulator which fills a pattern space 32 between the electrode patterns and the peripheral portion of an electrode pattern group composed of a plurality of electrode patterns.

Figure 13:
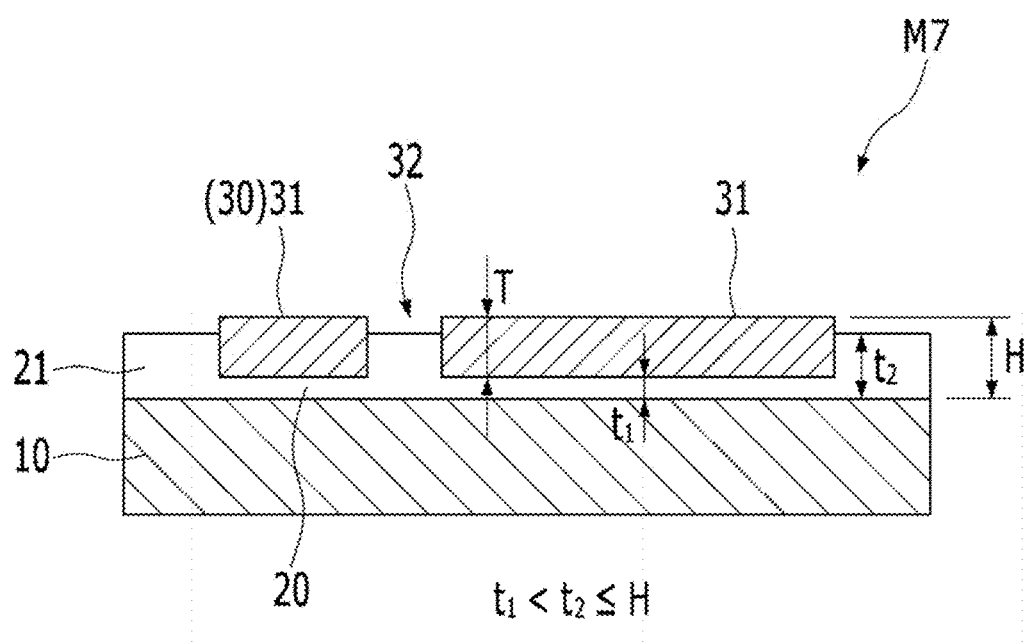
FIG. 13 illustrates a heat dissipating substrate for semiconductor in accordance with an embodiment of the present disclosure.

FIG. 13 illustrates a heat dissipating substrate for semiconductor in accordance with an embodiment of the present disclosure. FIG. 13 is a cross-sectional view of the heat dissipating substrate for semiconductor, taken along line II-II' of FIG. 0.12.

The heat dissipating substrate M7 for semiconductor includes a metal base 10, an insulating part 21 and a plurality of electrode patterns 31, which are sequentially stacked from the bottom of FIG. 13. The insulating part 21 includes an insulating layer 20, and the plurality of electrode patterns 31 are formed from an electrode metal plate 30. Between the respective electrode patterns 31, a pattern space 32 is disposed to electrically insulate the adjacent electrode patterns from each other. The pattern space 32 and the peripheral portion of an electrode pattern group composed of the plurality of electrode patterns 31 are filled with an insulating material.

The metal base 10 is made of a metal such as copper or aluminum, which has excellent thermal conductivity. The metal base 10 may be formed as a thick metal plate or metal block. Although not illustrated, a structure with heat dissipating fins may be formed at the bottom surface of the metal base 10 in order to raise the heat dissipating effect by expanding the contact area with the outside.

The insulating part 21 includes the insulating layer 20 formed between the metal base 10 and the electrode metal plate 30 and an insulating material filled portion formed by filling the pattern space 32 and the peripheral portion of the plurality of pattern electrodes with an insulator. The insulating layer 20 may include synthetic resin, oxide or nitride with an electrical insulating property. The insulating layer 20 may be made of a material with excellent thermal conductivity and heat-resisting property in addition to the electric insulation property. Furthermore, the insulating layer 20 may have an adhesion or bonding property and thus serve to bond the metal base 10 and the electrode metal plate 30 to each other. The insulating material filled portion may be made of the same material as the above-described insulating layer 20, and integrated with the insulating part 21. As the material of the insulating part 21, epoxy-based synthetic resin which satisfies the aforementioned conditions such as an electrical insulating property, thermal conductivity and heat-resisting property may be applied.

The electrode metal plate 30 may be made of a metal such as copper, copper-manganese alloy, aluminum or nickel, which has low specific resistance and exhibits excellent thermal conductivity and processability. The electrode patterns 31 are divided by a pattern space 32 which is formed by removing a portion of the electrode metal plate 30 up to the bottom thereof, and exposes the insulating layer 20.

Desirably, the electrode metal plate 30 may have a thickness T of 0.2 mm or more. When the thickness of the insulating layer 20 is represented by t1, the thickness of the insulator of the peripheral portion and the pattern space is represented by t2, and the height from the bottom surface of the insulating layer 20 to the top surface of the electrode pattern 31 is represented by H, the relationship is established as in Equation 1 below.

$$t1 < t2 \leq H \qquad \text{[Equation 1]}$$

In other words, the height of the insulator buried in the peripheral portion and the pattern space 32 may be higher than the bottom surface of the electrode pattern 31, and lower than or equal to the top surface of the electrode pattern 31. Such a structure may improve not only the insulating strength between the respective electrode patterns 31, but also the insulating strength between the heat dissipating substrate 101 for semiconductor and an external circuit. Furthermore, the structure in which at least a portion of the electrode pattern 31 is buried in the insulating material filled portion may improve the peel strength of the plurality of electrode patterns 31.

FIGS. 14A to 14D illustrate a process of preparing the heat dissipating substrate of FIG. 13.

Figure 14A:
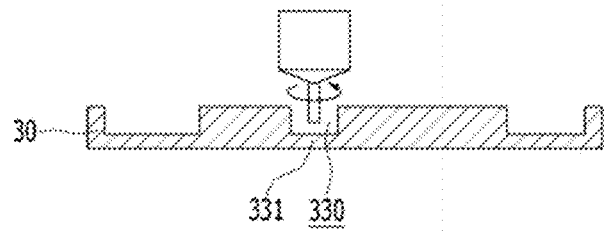
FIGS. 14A to 14D illustrate a process of preparing the heat dissipating substrate of FIG. 13.

As illustrated in FIG. 14A, a groove pattern 330 having a predetermined depth, which corresponds to the above-described pattern space and peripheral portion, is formed at one surface of the electrode metal plate 30 through a cutting process (milling) using a cutting tool such as an end mill. The groove pattern 330 is formed to have a smaller depth than the thickness of the electrode metal plate 30, such that a remaining portion 331 is left at the bottom of the groove pattern 330. When seen from the top, the remaining portion 331 may be left at all portions corresponding to the pattern space and the peripheral portion. The remaining portion 331 may have a thickness of less than 0.2 mm, or more desirably a thickness of 0.05 mm to 0.1 mm.

Figure 14B:
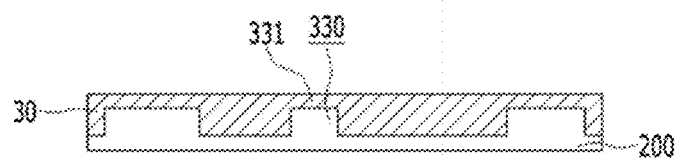
Figure 14B:
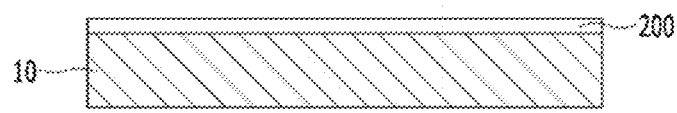

As illustrated in FIG. 14B, an insulating resin 200, e.g. epoxy resin, is printed onto the top surface of the metal base 10, and the same insulating resin 200 is printed onto the surface of the electrode metal plate 30, at which the groove pattern 330 is formed. Then, the electrode metal plate 30 is turned over and disposed toward the metal base 10, such that the two surfaces coated with the insulating resin 200 face each other.

Figure 14C:
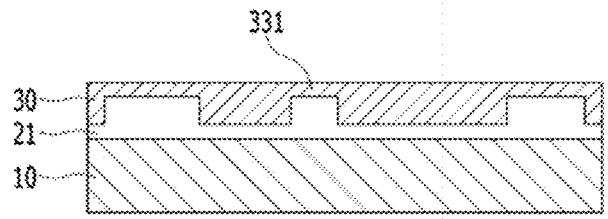

As illustrated in FIG. 14C, the members prepared in the process of FIG. 14B are bonded to each other through a vacuum hot pressing process. As a result, the insulating resins 20 printed as described above on the surfaces of the two members, facing each other, are cured as one body to form the insulating part 21.

Unlike the examples of FIGS. 14B and 14C, however, the insulating resin 200 may be applied at a sufficient thickness to any one surface of the top surface of the metal base 10 and the surface of the electrode metal plate 30, at which the groove pattern 330 is formed. Then, the metal base 10 and the electrode metal plate 30 may be bonded to each other.

Figure 14D:
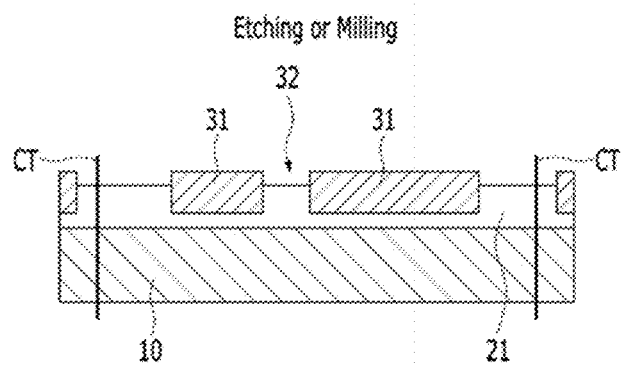

Then, as illustrated in FIG. 14D, the above-described remaining portion 331, i.e. the thin portion where the plurality of electrode patterns 31 divided by the above-described groove pattern 330 are connected to each other may be removed through etching or milling, in order to form the pattern space 32. Then, as the resultant structure is cut along a cutting line CT illustrated in FIG. 14D, the heat dissipating substrate for semiconductor is completed as a unit module.

Figure 15:
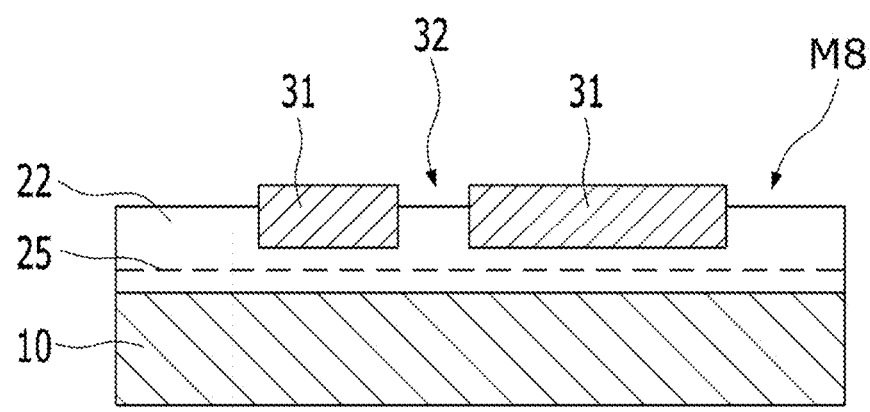
FIG. 15 illustrates a heat dissipating substrate for semiconductor in accordance with an embodiment of the present disclosure.

FIG. 15 illustrates a heat dissipating substrate for semiconductor in accordance with an embodiment of the present disclosure.

A heat dissipating substrate M8 for semiconductor in accordance with the present embodiment has the same structure as the heat dissipating substrate 101 for semiconductor in accordance with the embodiment of FIG. 13, except that the heat dissipating substrate M8 includes an insulating mesh 25 formed in an insulating part 22. The insulating mesh 25 may be a solid inorganic insulating material, e.g. a ceramic mesh. The insulating mesh 25 may be made of a ceramic material which has higher specific resistance and thermal conductivity than the insulating material constituting the other portion of the insulating part 22, thereby contributing to improving the insulating strength and thermal conductivity between an electrode pattern 31 and a metal base 10. Furthermore, the insulating mesh 25 may contribute to suppressing thermal expansion of the insulating part 22 or raising the mechanical strength of the insulating part 22.

Figure 16A:
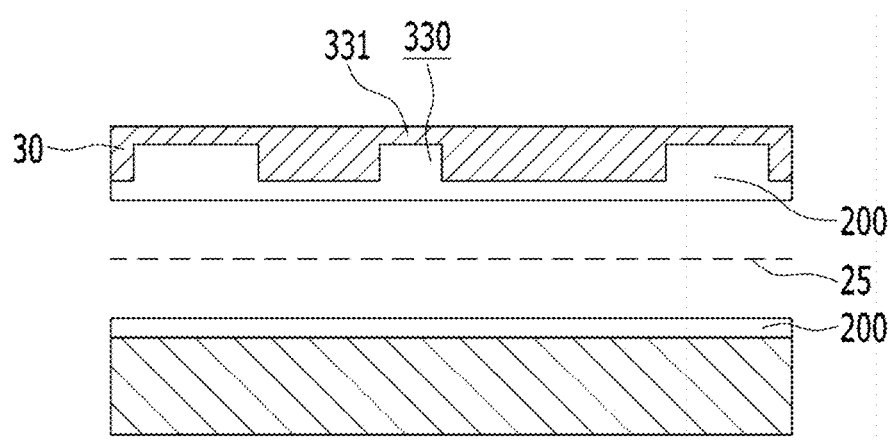
FIGS. 16A and 16B illustrate a process of preparing the heat dissipating substrate of FIG. 15.
Figure 16B:
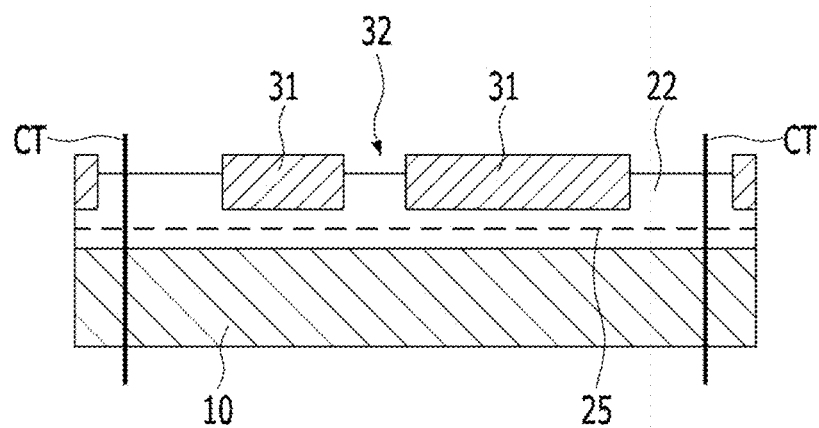

FIGS. 16A and 16B illustrate a process of preparing the heat dissipating substrate of FIG. 15.

Referring to FIG. 16A, insulating resins 200 are respectively printed on the surface of an electrode metal plate 30, at which a groove pattern 330 is formed, and the top surface of the metal base 10, as in FIG. 15B. Then, the insulating mesh 25 is disposed between the insulating resins 200 facing each other.

Referring to FIG. 16B, the electrode metal plate and the metal base 10 are bonded to each other through a vacuum hot pressing process, with the insulating mesh 25 interposed into the insulating part 22, and the remaining portion is removed through an etching or milling process as in FIG. 3D, such that the plurality of electrode patterns 31, a pattern space 32 and a peripheral portion are formed. Then, when the resultant structure is cut along a cutting line CT, the heat dissipating substrate for semiconductor in accordance with the present embodiment is completed.

Figure 17:
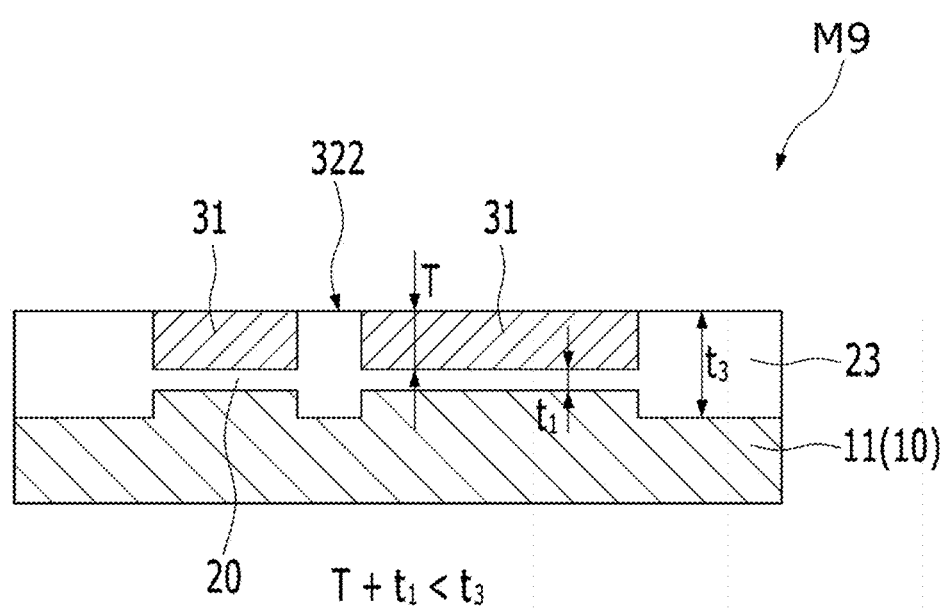
FIG. 17 illustrates a heat dissipating substrate for semiconductor in accordance with an embodiment of the present disclosure.

FIG. 17 illustrates a heat dissipating substrate for semiconductor in accordance with an embodiment of the present disclosure.

In a heat dissipating substrate M9 for semiconductor in accordance with the present embodiment, a portion constituting a pattern space 322 between a plurality of electrode patterns 31 in an insulating part 23 and a portion constituting a peripheral portion outside the plurality of electrode pattern 31 are formed to have the following structure. First, the top surface of the insulating part 23 is formed to have the same height as the top surfaces of the plurality of electrode pattern 31. Second, the bottom surface of the insulating part 23 at the corresponding portion is expanded in the thickness direction of a metal base 11. That is, the other portions except the portions of the top surface of the metal base 11, facing the bottom surfaces of the electrode patterns 31, are recessed to a predetermined depth and then filled with an insulator.

In other words, when the thickness of the electrode pattern 31 is represented by T, the thickness of an insulating layer between the electrode pattern 31 and the metal base 11 is represented by t1, and the thickness of the portion of the insulating part 23, corresponding to the pattern space 322 and the peripheral portion, is represented by t3, the relationship is established as in Equation 2 below.

$$T+t1<t3 \qquad \text{[Equation 2]}$$

In a heat dissipating substrate 103 having such a structure, the side surfaces of the electrode pattern 31 are completely buried in the insulating part 23. Thus, as in the embodiment of FIG. 13, not only the insulating strengths between the respective electrode patterns 31 and between the heat dissipating substrate 103 for semiconductor and an external conductor, but also the peel strength of the electrode pattern 31 are improved. Since the pattern space 322 and the peripheral portion in the insulating part 23 are engaged with and supported by a stepped portion formed at the top surface of the metal base 11, such a structure may reliably support a horizontal load, and prevent deformation and damage caused by a difference in thermal expansion between the metal and the insulator. Such a structure improves the peel strength between the insulating part 23 and the metal base 11.

Figure 18A:
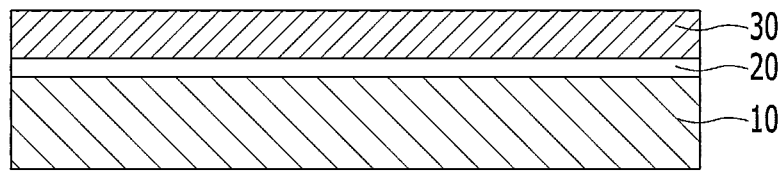
FIGS. 18A to 18C illustrate a process of preparing the heat dissipating substrate of FIG. 17.
Figure 18B:
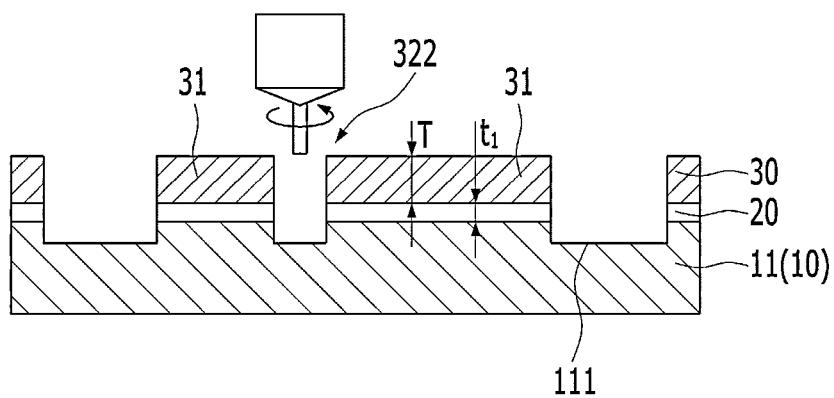
Figure 18C:
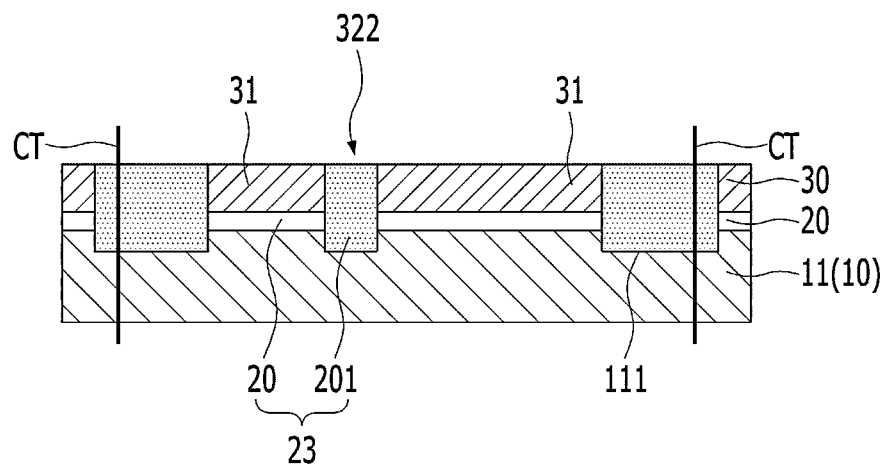

FIGS. 18A to 18C illustrate a process of preparing the heat dissipating substrate of FIG. 17.

As illustrated in FIG. 18A, a multilayered substrate in which a metal base 10, an insulating layer 20 and an electrode metal plate 30 are sequentially stacked from the bottom is prepared. Such a multilayered substrate may be prepared by printing or applying an insulating resin between two facing surfaces of the metal base 10 and the electrode metal plate 30 and bonding the insulating resin and the surfaces through a vacuum hot pressing process, in such a manner described in the aforementioned embodiment.

As illustrated in FIG. 18B, a groove pattern is formed by cutting the pattern space 322 between the electrode patterns 31 and a peripheral portion outside an electrode pattern group composed of the plurality of electrode patterns 31 to a larger depth than the top surface of the metal base 10 from the surface of the electrode metal plate 30 through a cutting process, e.g. a milling process using an end mill tool. That is, the peripheral portion is cut to a larger depth than the sum of a thickness T of the electrode metal plate 30 and a thickness t1 of the insulating layer 20, such that a stepped portion 111 whose bottom surface has a smaller height than a portion facing the bottom surface of the electrode pattern 31 is formed at the top of the metal base 11.

Then, as illustrated in FIG. 18C, the groove pattern as a cut portion is filled with an insulating resin, and the insulating resin is cured to form an insulating material filled portion 201. The insulating material filled portion 201 may be formed of the same insulating material as the above-described insulating layer 20. Through this process, the insulating layer 20 and the insulating material filled portion 201 are integrated with each other at the insulating part 23. When the resultant structure is cut along a cutting line CT, the heat dissipating substrate for one semiconductor module is completed.

Figure 19:
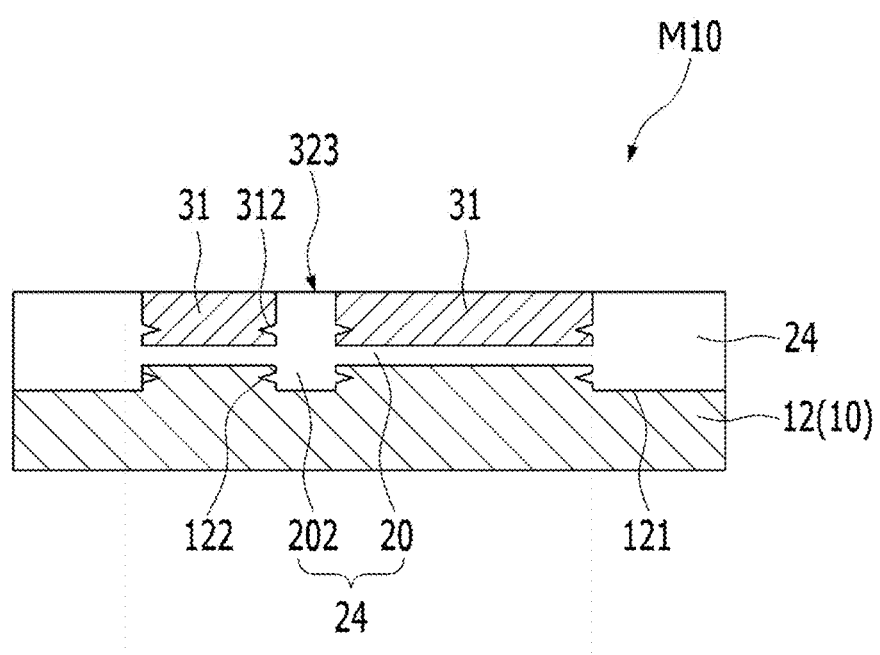
FIG. 19 illustrates a heat dissipating substrate for semiconductor in accordance with an embodiment of the present disclosure.

FIG. 19 illustrates a heat dissipating substrate for semiconductor in accordance with an embodiment of the present disclosure.

A heat dissipating substrate M10 for semiconductor in accordance with the present embodiment is different from the heat dissipating substrate 103 for semiconductor in accordance with the embodiment of FIG. 6 in that the heat dissipating substrate M10 includes a first notch 312 formed at a side surface of the electrode pattern 31 through a cutting process and/or a second notch 122 formed at a side surface of a stepped portion 121 of the metal base 12 through a cutting process. The other components of the present embodiment are the same as those of the embodiment of FIG. 6, except the structure of an insulating material filled portion 202 formed by filling the first notch 312 and/or the second notch 122 with an insulating material.

The first and second notches 312 and 122 may be concavely formed from the side surfaces perpendicular to the top/bottom surfaces of the electrode pattern 31 and the metal base 12. The first and second notches 312 and 122 may be formed through a cutting process using a form tool which is manufactured in a shape corresponding to the shape of each of the groove pattern and the notch, instead of a general end mill, during the cutting process described with reference to FIG. 7B. The notch may be formed at the same time as the groove pattern, and formed after the groove pattern is formed. The cutting process using the form tool may be performed in a direction parallel to the metal base 12.

A heat dissipating substrate 104 for semiconductor in accordance with the present embodiment may include both or any one of the first notch 312 and the second notch 122. Through the first and second notches 312 and 122, the side surface of an insulating material filled portion 202 may be engaged with the electrode pattern 31 and the metal base 12, which makes it possible to improve the peel strength of the heat dissipating substrate 104 for semiconductor.

INDUSTRIAL APPLICABILITY

The present disclosure may be used for manufacturing a heat dissipating substrate which functions as a heat dissipating plate and a circuit board for mounting a semiconductor element. The heat dissipating substrate for semiconductor in accordance with the present disclosure may be utilized for manufacturing a semiconductor module including a power semiconductor element or high-power LED.

The invention claimed is:

1. A preparation method of a heat dissipating substrate for a semiconductor, which includes a plurality of electrode patterns, a pattern space formed between each two of the plurality of electrode patterns so as to electrically insulate the plurality of electrode patterns, and a peripheral portion surrounding an outside of an electrode pattern group composed of the plurality of electrode patterns, the preparation method comprising:

forming a groove pattern corresponding to the pattern space and the peripheral portion by cutting an electrode metal plate, which is to form the plurality of electrode patterns, from one surface of the electrode metal plate to a predetermined depth smaller than a thickness of the electrode metal plate and leaving a remaining portion;

printing an insulating resin onto the one surface of the electrode metal plate having the groove pattern formed therein or both of the one surface of the electrode metal plate and one surface of a metal base facing the electrode metal plate, such that the groove pattern is filled with the insulating resin, and bonding the electrode metal plate and the metal base with the insulating resin; and separating the plurality of electrode patterns from each other by removing the remaining portion.

2. The preparation method of claim 1, wherein the remaining portion is removed through a cutting process.

3. The preparation method of claim 1, wherein when the electrode metal plate and the metal base are bonded, the insulating resin is printed onto each of the one surface of the electrode metal plate and the one surface of the metal base, and the electrode metal plate and the metal base are bonded to each other with an insulating ceramic mesh inserted therebetween.

4. The preparation method of claim 1, wherein the remaining portion is removed through an etching process.

5. The preparation method of claim 1, further comprising forming a reinforcement protrusion connected to the insulating resin simultaneously with bonding the electrode metal plate and the metal base by forming a groove in the one surface of the electrode metal plate or the one surface of the metal base facing the electrode metal plate before the bonding such that the groove is filled with the insulating resin while bonding the electrode metal plate and the metal base.

\* \* \* \* \*